US007436673B2

United States Patent
Wang et al.

(10) Patent No.: US 7,436,673 B2
(45) Date of Patent: Oct. 14, 2008

(54) HEAT SINK FIXING ASSEMBLY

(75) Inventors: Feng-Ku Wang, Taipei (TW); Yi-Lun Cheng, Taipei (TW); Jui-Chan Fan, Taipei (TW); Chun-Yi Chang, Taipei (TW); Chun-Lung Lin, Taipei (TW); Chih-Kai Yang, Taipei (TW)

(73) Assignee: Inventec Corporation, Taipei (TW)

( * ) Notice: Subject to any disclaimer, the term of this patent is extended or adjusted under 35 U.S.C. 154(b) by 48 days.

(21) Appl. No.: 11/606,001

(22) Filed: Nov. 30, 2006

(65) Prior Publication Data

US 2008/0130240 A1 Jun. 5, 2008

(51) Int. Cl.
*H05K 7/20* (2006.01)
*F28F 7/00* (2006.01)
*H01L 23/34* (2006.01)

(52) U.S. Cl. ........... 361/719; 165/80.2; 165/104.33; 165/185; 361/700; 257/718; 257/719

(58) Field of Classification Search ......... 257/718–719; 361/700, 719–720
See application file for complete search history.

(56) References Cited

U.S. PATENT DOCUMENTS

| 5,541,811 | A * | 7/1996 | Henningsson et al. ........ 361/704 |
| 5,930,115 | A * | 7/1999 | Tracy et al. ........ 361/704 |
| 6,353,577 | B1 * | 3/2002 | Orban et al. ........ 367/43 |
| 6,567,269 | B2 * | 5/2003 | Homer et al. ........ 361/700 |
| 6,683,449 | B1 * | 1/2004 | Bell et al. ........ 324/158.1 |
| 6,865,082 | B2 * | 3/2005 | Huang et al. ........ 361/700 |
| 6,958,913 | B2 * | 10/2005 | Koo ........ 361/704 |
| 6,992,893 | B2 * | 1/2006 | Miyamura et al. ........ 361/705 |
| 7,031,162 | B2 * | 4/2006 | Arvelo et al. ........ 361/718 |
| 7,310,226 | B2 * | 12/2007 | Chen et al. ........ 361/695 |
| 2005/0117307 | A1 * | 6/2005 | Tanaka ........ 361/719 |
| 2007/0236887 | A1 * | 10/2007 | Cheng et al. ........ 361/700 |
| 2008/0013285 | A1 * | 1/2008 | Hung ........ 361/719 |

* cited by examiner

*Primary Examiner*—Gregory D Thompson
(74) *Attorney, Agent, or Firm*—Rabin & Berdo, P.C.

(57) ABSTRACT

A fixing structure of heat conduction pad is used to uniformly press two heat conduction pads on the two heat generating electronic components on a circuit board respectively. The fixing structure includes a fixing member and an elastic member. The two ends of the elastic member are a fastening portion and a fixing portion respectively. The middle part of the elastic member is a pressing portion. In addition, a suspension arm is extended from the fixing portion. When the fastening portion is to be fasten on the circuit board and the fixing portion is to be fixed on the circuit board by the fixing member, the pressing portion presses one of the heat conduction pad on one of the heat generating electronic component, and the suspension arm presses the other heat conduction pad on the other heat generating electronic component.

14 Claims, 4 Drawing Sheets

HEAT SINK FIXING ASSEMBLY

BACKGROUND OF THE INVENTION

1. Field of Invention

The present invention relates to a heat sink fixing assembly applied to a heat conduction pad in a heatsink module, and more particularly, to a heat sink fixing assembly by combining a fixing member and an elastic member with elastic controlling means to fix a heat conduction pad.

2. Related Art

For increasing computer operation speed and function, more and more electronic components such as CPUs, chips, and power ICs are added in the computer. Generally speaking, when those electronic components work, the components will consume power and generate heat in the computer inside. Hence, the computer may be easy to crash down under the increasing temperature. Therefore, how to reduce the temperature inside the computer to main the stability of the computer operation is an important issue.

To effectively eliminate heat generated by electronic components, heatsink module manufacturers design and provide various kinds of heatsink module assembly. As shown in FIG. 1, a conventional heatsink assembly used for dissipating heat generated by a CPU is provided as an example. In FIG. 1, a heat conduction pad 10a is stacked on a CPU. A heat conductive pipe 20a and a fin heatsink 60a are incorporated with the heat conduction pad 10a for removing the heat generating by the CPU. The heat conduction pad 10a is a high thermal conductive metal block in order to conduct the heat to the heat conductive pipe 20a. Then through the phase transformation function by the fluid inside the heat conductive pipe 20a, heat again is transferred to the fin heatsink 60a, thus achieving a heat dissipating effect.

The above-mentioned heat sink assembly composed of the heat conduction pad incorporated with the heat conductive pipe and the fin heatsink has a feature of fully compressed thickness. Especially, it can be used in the laptop computer, which has characters of small in size, slim in shape, and light in weight. In addition, for the heat sink assembly manufacturers, not only good heat dissipating efficiency for removing the heat generating by electronic component is needed, but the manufacturing efficiency and cost of the heat sink assembly are also needed to be taken as a consideration for enhancing the competitive edge of the product.

In the manufacturing of a heatsink assembly, the conventional heat conduction pads are often made by die-cast molding. The die-cast molding has the shortfalls of higher cost and heavy weight. Therefore, the aluminum element used for contacting with the CPU chip in the heat conduction pad is often formed by a metal sheet stamping instead of die-cast molding. The weight of the new type heat conduction pad 10a is lighter, but the strength of the heat conduction pad 10a becomes weak, which may cause the problem of deformation due to unbalanced applied force during the assembly process. In the conventional method, an operator usually uses screw means to fix the heat conduction pad 10a on the CPU. However, the applied force for screwing will not be the same. The deformation may cause the problem of reducing the contact area between the heat conduction pad 10a and the CPU, thus affecting heat conducting effect. Hence in the conventional device, an auxiliary block 11a is needed to reinforce the structure as shown in FIG. 1. However, the assembly process of the heat sink assembly becomes more complicated and cost-consuming because of adding the auxiliary block 11a onto the heat conduction pad 10a.

Besides, on the circuit board, other components such as Northbridge chip also require a heatsink for dissipating heat during operation. Therefore, many heatsinks and auxiliary elements are needed, which will obviously increase production costs.

SUMMARY OF THE INVENTION

It is an object of the present invention to provide a heat sink fixing assembly applied to heat conduction pads for solving that the contact area between the heat conduction pad and the heat generating electronic component may be unable to fully contact with each other because the applied force is unbalanced during the assembly, which may incur a deformation problem.

It is another object of the present to provide a heat sink fixing assembly applied to heat conduction pads for fixing two conduction pads in the same time by the heat sink fixing assembly.

To achieve aforementioned objects, the present invention provides a heat sink assembly applied to the heat conduction pad in the heatsink module, wherein a first conduction pad is pressed on a heat generating electronic component mounted on a circuit board. The heat sink fixing assembly comprises an elastic member and a fixing member, wherein one end of the elastic member is a fastening portion and the other end is a fixing portion. In addition, a pressing portion is located between the elastic portion and the fastening portion. When the fastening portion is fastened on the circuit board through the fixing member, the pressing portion is pressed on the first heat conduction pad toward the first heat generating electronic component so as to reduce the amount of screw use.

Both the fastening portion and the pressing portion are extend from the fixing portion and symmetrically with the first heat generating electronic component; therefore, when the pressing portion is pressed on the first heat conduction pad, the applied force of the pressing portion onto the first heat conduction pad is equally distributed so as to prevent the deformation problem of prior art.

In addition, there is a suspension arm stretched from the fixing portion. Hence, when the circuit board has a second heat conduction pad stacked with a second heat generating electronic component and the fixing portion of the heat sink fixing assembly is fixed by a fixing member, the suspension arm can be used to press the second heat conduction pad on the second heat generating electronic component. This is to be noted that the suspension arm may have a pressing plate. The surface of the pressing plate may contact with the second heat conduction pad to let the pressing force provided by the suspension arm equally distribute on the surface of the second heat conduction pad.

The features and practice of the present invention will be illustrated below in detail through preferred embodiments with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus is not limitative of the present invention, and wherein.

DETAILED DESCRIPTION OF THE INVENTION

In accordance with the disclosed heat sink fixing assembly applied to a heat conduction pad on a circuit board, the heat conduction pad referred herein is applied to a CPU chip. However, the present invention is nevertheless not limited to the example of the CPU chip though. Any IC chip that generates heat can make use of the technique disclosed herein. In the following description, the CPU chip is used as a preferred embodiment.

Figure 1:
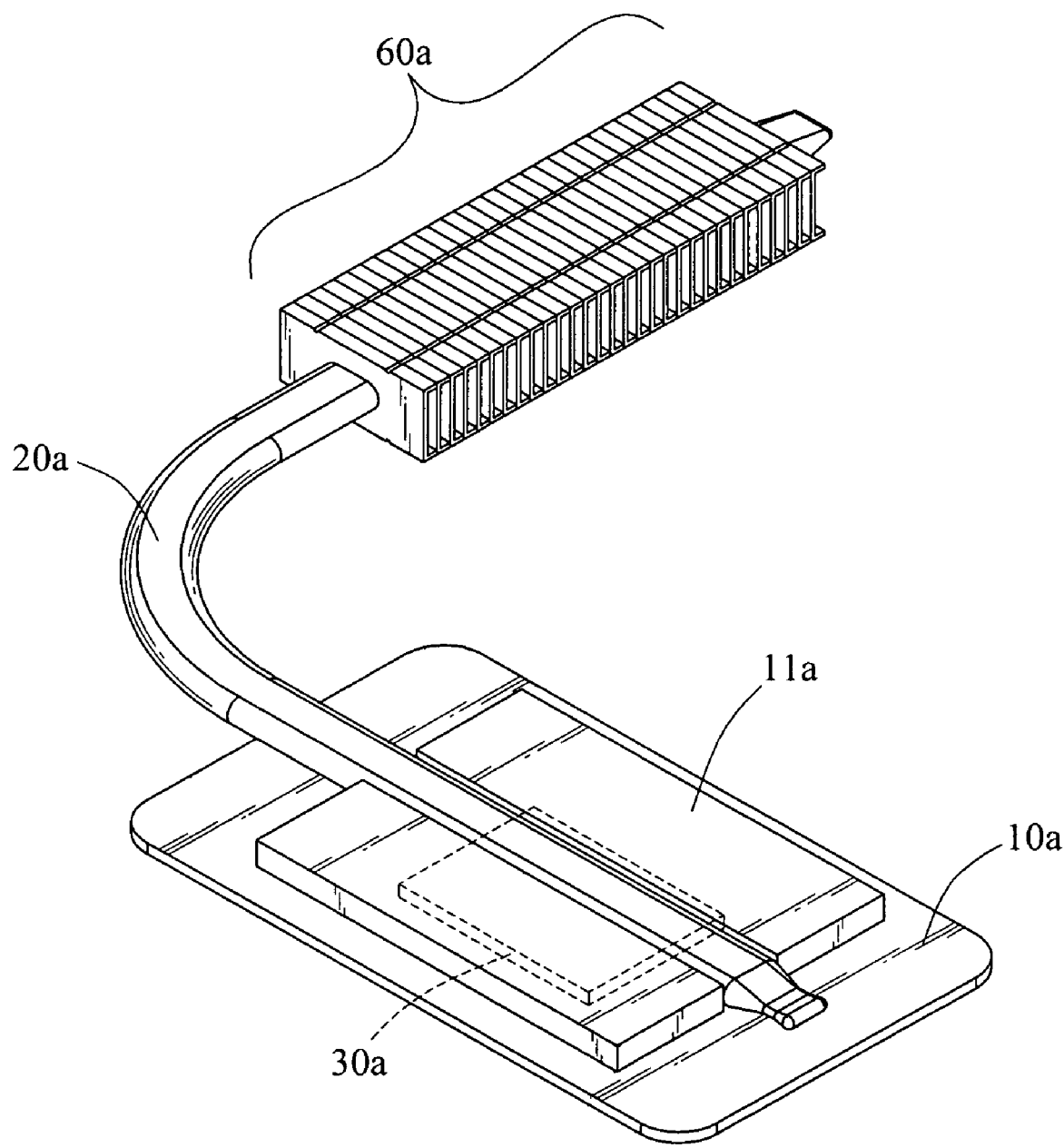
FIG. 1 is a schematic view of the structure of a conventional fixing structure.
Figure 2:
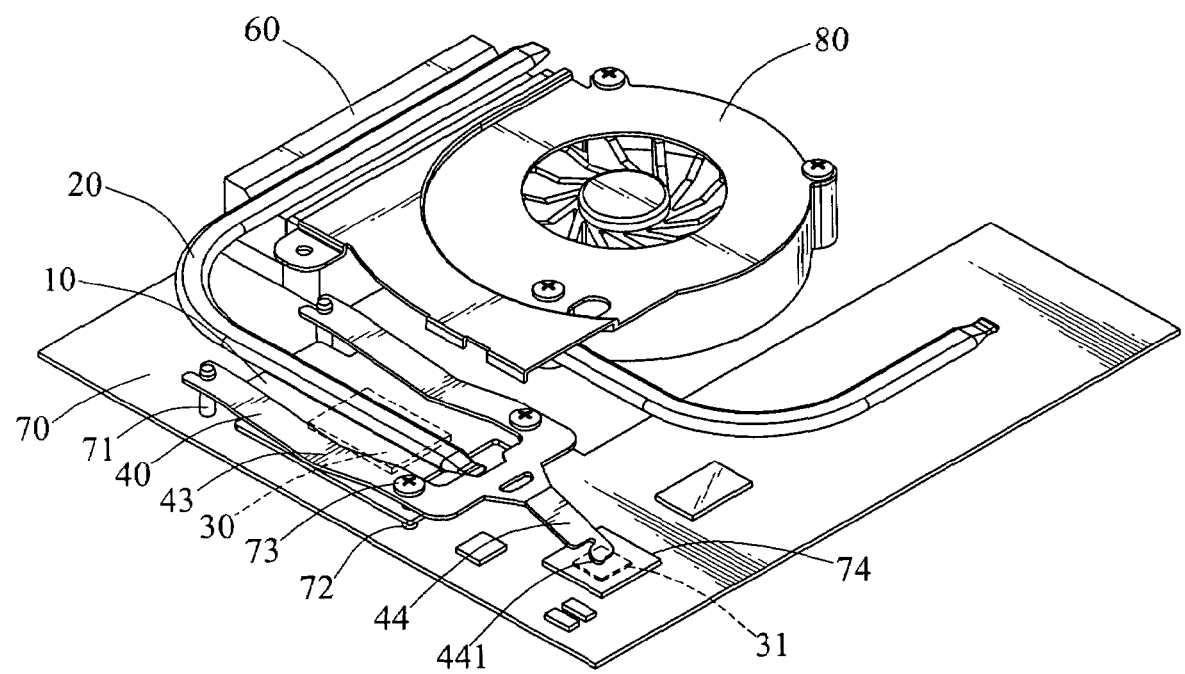
FIG. 2 is a schematic view of the structure of a heat sink fixing assembly according to the present invention.
Figure 3:
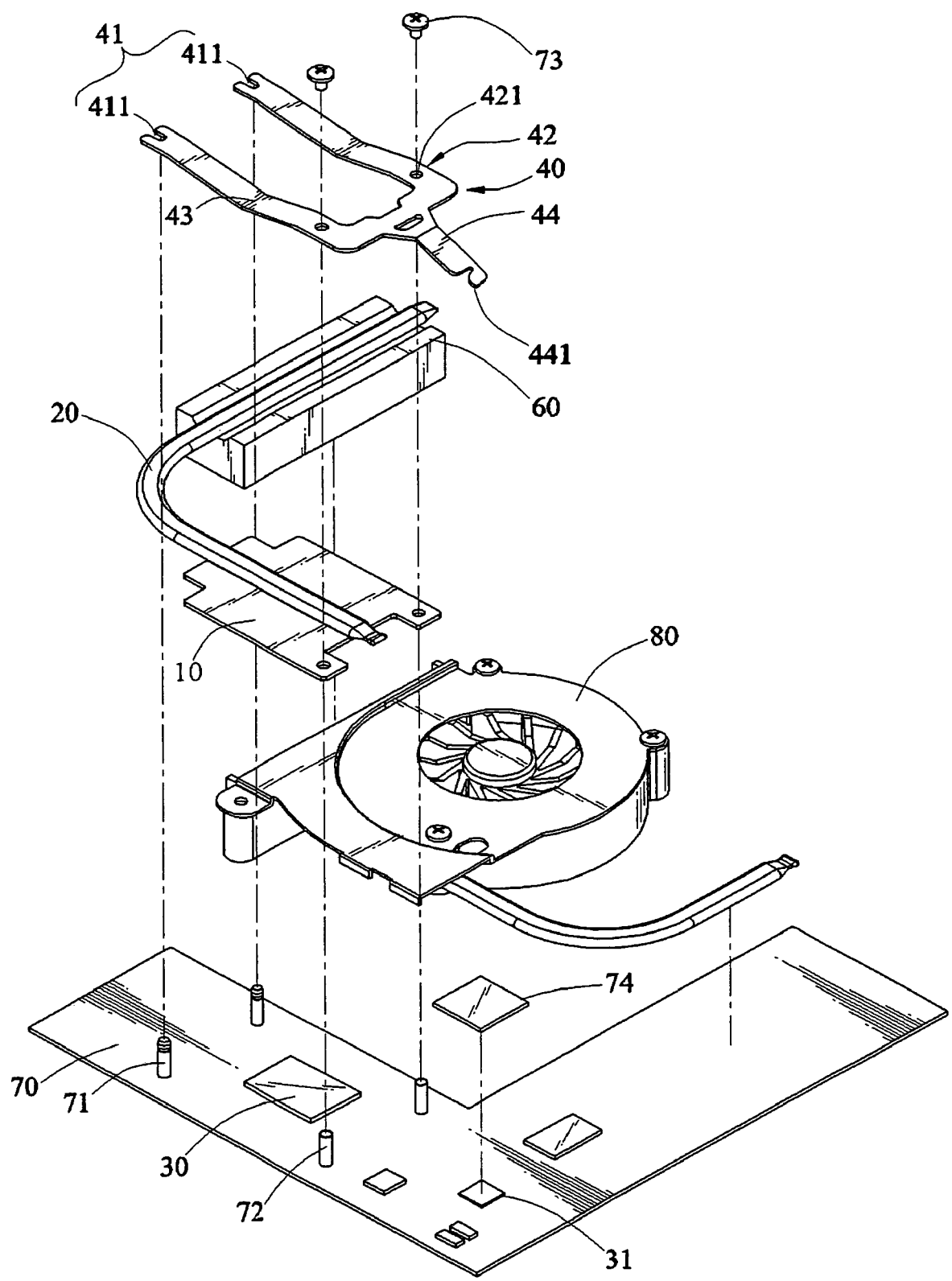
FIG. 3 is a schematic view showing the exploded structure of the heat sink fixing assembly according to the present invention.

The embodiment is illustrated in FIGS. 2 and 3. A first heat generating electronic component 30 (such as a CPU) and a second heat generating electronic component 31 (such as a Northbridge chip) are disposed on a circuit board. A first heat conduction pad 10 and a second heat conduction pad 74 are disposed on the top surface of the first and second heat generating electronic components 30, 31 respectively to dissipate heat out of the first and second heat electronic components 30, 31. Then, according to the design of heat conduction path, a heat conductive pipe 20 is provided and used to conduct the heat from the first heat conduction pad 10, and a fin heatsink 60 and a fan device 80 are disposed on the other end of the heat conductive pipe 20. The material of the first heat conduction pad 10 may be copper, aluminum, or their alloy. The conduction effect and system design are taken as a consideration of material selection.

The heat sink fixing assembly used to fix the first and second heat conduction pads includes fixing members 73 and an elastic member 40. The elastic member 40 has a fastening portion 41 having two legs, a fixing portion 42, two pressing portions 43, and a suspension arm 44 extended from one end of the elastic member 40. The pressing portion 43 is located between the fastening portion 41 and the fixing portion 42. In addition, the fastening portion 41 has two U-shaped openings 411, and the U-shaped openings 411 are used to hook the joint pins 71 of the circuit board. Then, the fixing members 73 (such as a screw in FIG. 2 and FIG. 3) pass through the screw holes 421 of the fixing portion 42 and then fix on the screw posts 72 of the circuit board 70. When the fastening portion 41 is fastened on the circuit board 70 and the fixing portion 42 is fixed on the circuit board 70, the first heat conduction pad 10 is pressed by the pressing portion 43 toward the first heat generating electronic component 30, thus achieving the purpose of fixing.

The pressing portions 43 are symmetrically extended outward from the fixing portion 42 and symmetrical to the first heat generating electronic components 30 functioning as a center. Therefore, when the pressing portion 43 is pressed on the first heat conduction pad 10, a pressing force of the pressing portion 43 can be uniformly distributed on the first heat conduction pad 10 so that the conduction pad 10 and the first heat generating electronic components 30 can be tightly contacted with each other.

In addition, after the fixing portion 42 is fixed on the circuit board 70, the suspension arm 44 is pressed on the second heat conduction pad 74. The second heat conduction pad 74, therefore, is pressed on the second heat generating electronic component 31. Hence, with a one-time fixing operation, the purpose of fixing two heat conduction pads is achieved. The place where the suspension arm 44 presses on the second heat conduction pad 74 may has a pressing plate 441 used for increasing a contact area with the second heat conduction pad 74, so as to avoid the deformation problem on the second heat conduction pad 74.

Figure 4A:
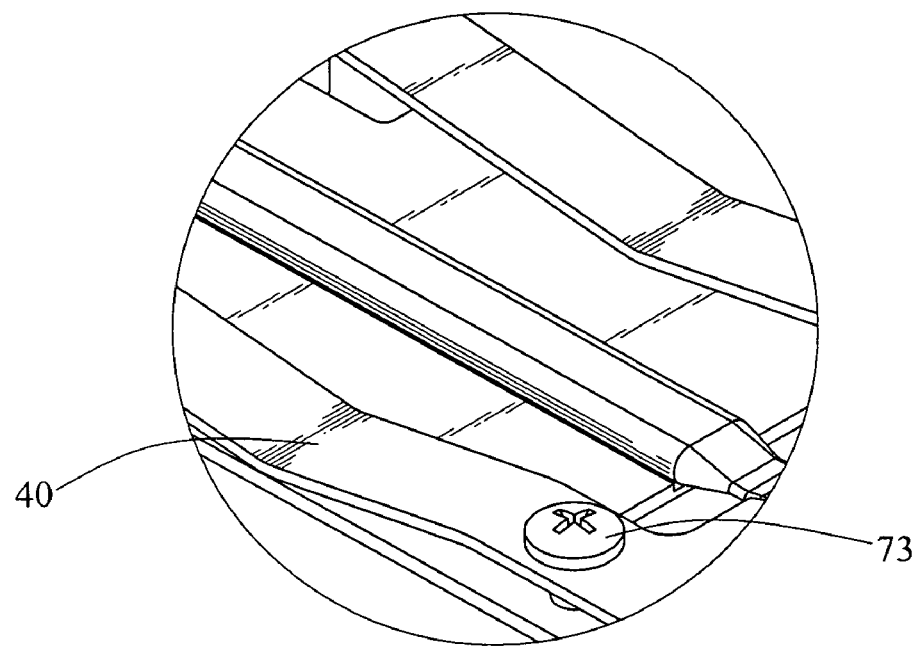
FIG. 4A is a schematic view showing the structure of the pressing portion of an elastic member according to the present invention.
Figure 4B:
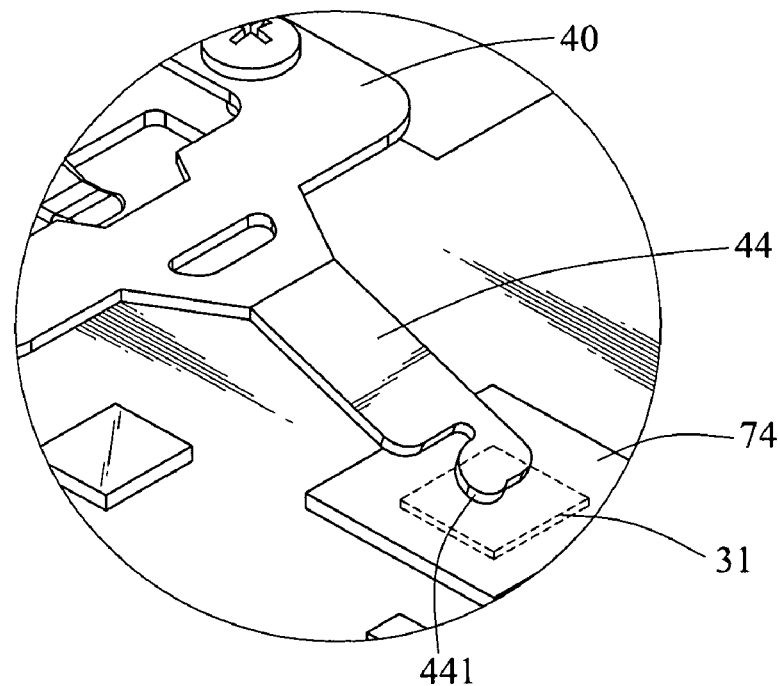
FIG. 4B is a schematic view showing the structure of the suspension arm of the elastic member according to the present invention.

As shown in FIGS. 3, 4A, and 4B, when the U-shape openings 411 of the fastening portion 41 are buckled with the joint pins 71, the elastic member 40 is attached to the first heat conduction pad 10, and the pressing portions 43 are against the first heat conduction pad 10 (as shown in FIG. 4A), so that the fixing portion 42 has an angle with respect to the first heat conduction pad 10 for the screw post 72 to go through the screw hole 421 on the elastic member 40. The elastic member 40 thus is attached to the first heat conduction pad 10. The elastic member 40 can provide a sufficient downward pressing force on the first heat conduction pad 10, so that the first heat conduction pad is in tight contact with the CPU chip 30. The suspension arm 44 extended from one end of the elastic member 40 makes the second heat conduction pad 74 depressed by the pressing plate 441 on the suspension arm 44 (as shown in FIG. 4B). The suspension arm 44 provides a downward pressing force to make a tight connection between the second heat conduction pad 74 and the Northbridge chip 31. A fan device 80 is also combined on the circuit board 70.

With continual reference to FIG. 2, the heat generated by the CPU chip 30 is transferred to the first heat conduction pad 10, and then the first heat conduction pad 10 conducts the heat to the heat conductive pipe 20 coupled thereto. The capillary structure of the heat conductive pipe 20 and the working fluid therein then transfer the heat to the fin heatsink 60. With a cool airflow produced by the fan device 80 passing through the fin heatsink 60, the heat is dissipated to outside environment, achieving the goal of lowering the temperature of the CPU chip 30. Moreover, the Northbridge chip 31 also receives a depressing force to ensure its contact area.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat sink fixing assembly, applied to a first heat conduction pad to press the first heat conduction pad onto a first heat generating electronic component, wherein the first heat generating electronic component is disposed on a circuit board, the heat sink fixing assembly comprising
   a fixing member; and
   an elastic member, including a fastening portion located at one end of the elastic member, and a fixing portion located at an opposite end of the elastic member, the fastening portion including two legs, each extending from the fixing portion and being symmetrical to the first heat generating electronic component, each leg having a pressing portion at a middle part thereof, wherein when the fastening portion is fastened on the circuit board and the fixing portion is fixed on the circuit board by the fixing member, the pressing portions press the first heat conduction pad toward the first heat generating electronic component.

2. The heat sink fixing assembly as claimed in claim 1, wherein the pressing portions are symmetrical to the first heat generating electronic component functioning as a center and symmetrically pressed on the first heat conduction pad.

3. The heat sink fixing assembly as claimed in claim 1, wherein the circuit board has a screw post located at a position corresponding to the fixing portion, the fixing member being a screw, and a position on the fixing portion corresponding to the screw has a screw hole, the fixing member passing through the screw hole and being fixed to the screw post.

4. The heat sink fixing assembly as claimed in claim 1, wherein the circuit board has a joint pin located at a position corresponding to the fastening portion, and the fastening portion has a U-shaped opening used to hook the joint pin.

5. A heat sink fixing assembly, applied to a first heat conduction pad and a second heat conduction pad to press the first heat conduction pad and the second heat conduction pad onto a first heat generating electronic component and a second heat generating electronic component respectively, wherein the first heat generating electronic component and the second heat generating electronic component are disposed on a circuit board and the first heat generating electronic component is adjacent to the second heat generating electronic component, the heat sink fixing assembly comprising
a fixing member; and
an elastic member, including a fixing portion, a fastening portion, a pressing portion and a suspension arm extending from the fixing portion, the fastening portion being located at one end of the elastic member, the fixing portion being located at an opposite end of the elastic member, the pressing portion being located between the fixing portion and the fastening portion,
wherein when the fastening portion is fastened on the circuit board and the fixing portion is fixed on the circuit board by the fixing member, the pressing portion presses the first heat conduction pad towards the first heat generating electronic component, and the suspension arm is used to press the second heat conduction pad on the second heat generating electronic component.

6. The heat sink fixing assembly as claimed in claim 5, wherein the suspension arm has a pressing plate, and the pressing plate is used to press the second heat conduction pad by means of surface contact.

7. The heat sink fixing assembly as claimed in claim 6, wherein the pressing plate is symmetrical to the second heat generating electronic component and symmetrically pressed on the second heat conduction pad.

8. The heat sink fixing assembly as claimed in claim 5, wherein the pressing portion is symmetrical to the first heat generating electronic component functioning as a center and symmetrically pressed on the first heat conduction pad.

9. The heat sink fixing assembly as claimed in claim 5, wherein the circuit board has a screw post located at a position corresponding to the fixing portion, the fixing member being a screw, and a position on the fixing portion corresponding to the screw has a screw hole, the fixing member passing through the screw hole and being fixed to the screw post.

10. The heat sink fixing assembly as claimed in claim 5, wherein the circuit board has a joint pin located at a position corresponding to the fastening portion, and the fastening portion has a U-shaped opening used to hook the joint pin.

11. A heat sink fixing assembly, applied to a first heat conduction pad and a second heat conduction pad to press the first heat conduction pad and the second heat conduction pad onto a first heat generating electronic component and a second heat generating electronic component respectively, wherein the first heat generating electronic component and the second heat generating electronic component are disposed on a circuit board and the first heat generating electronic component is adjacent to the second heat generating electronic component, the heat sink fixing assembly comprising
a fixing member;
an elastic member, including a fastening portion, a fixing portion, and a suspension arm, the fastening portion being located at one end of the elastic member and including two legs, each leg extending from the fixing portion and being symmetrical to the first heat generating electronic component, each leg having a pressing portion at a middle part thereof, the fixing portion being located at an opposite end of the elastic member, the suspension arm being extended from the fixing portion of the elastic member,
wherein when the fastening portion is fastened on the circuit board and the fixing portion is fixed on the circuit board by the fixing member, the pressing portions press the first heat conduction pad toward the first heat generating electronic component, and the suspension arm is used to press the second heat conduction pad on the second heat generating electronic component.

12. The heat sink fixing assembly as claimed in claim 11, wherein the pressing portions are symmetrical to the first heat generating electronic component functioning as a center and symmetrically pressed on the first heat conduction pad.

13. The heat sink fixing assembly as claimed in claim 11, wherein the circuit board has a screw post at a position corresponding to the fixing portion, the fixing member being a screw, and a position on the fixing portion corresponding to the screw has a screw hole, the fixing member passing through the screw hole and being fixed to the screw post.

14. The heat sink fixing assembly as claimed in claim 11, wherein the circuit board has a joint pin at a position corresponding to the fastening portion, and the fastening portion is a U-shaped opening used to hook the joint pin.

* * * * *